(12) United States Patent
Misic et al.

(10) Patent No.: US 6,512,374 B1
(45) Date of Patent: Jan. 28, 2003

(54) MR LOCAL IMAGING COIL OPERABLE AS A RECEIVE ONLY OR A TRANSMIT/RECEIVE COIL

(75) Inventors: George J. Misic, Allison Park, PA (US); John Dolinar, North Huntington, PA (US); William J. Monski, Sewickley, PA (US); Theodore Reisker, Aurora, OH (US); Dennis Manley, Gibsonia, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 09/558,493

(22) Filed: Apr. 26, 2000

Related U.S. Application Data
(60) Provisional application No. 60/131,077, filed on Apr. 26, 1999.

(51) Int. Cl.[7] .................................................. G01V 3/00
(52) U.S. Cl. ........................ 324/319; 324/318; 324/322
(58) Field of Search .............................. 324/319, 318, 324/322, 307, 309

(56) References Cited

U.S. PATENT DOCUMENTS

| | | | |
|---|---|---|---|
| 4,717,881 A | * 1/1988 | Flugan | 324/322 |
| 4,725,779 A | 2/1988 | Hyde et al. | |
| 4,833,409 A | * 5/1989 | Eash | 324/318 |
| 4,975,644 A | 12/1990 | Fox | |
| 5,075,624 A | * 12/1991 | Bezjak | 324/318 |
| 5,136,244 A | 8/1992 | Jones et al. | |
| 5,196,796 A | 3/1993 | Misic et al. | |
| 5,256,971 A | 10/1993 | Boskamp | |
| 5,258,717 A | 11/1993 | Misic et al. | |
| 5,315,251 A | 5/1994 | Derby | |
| 5,347,220 A | 9/1994 | Van Heelsbergen | |
| 5,355,087 A | 10/1994 | Claiborne et al. | |
| 5,384,536 A | * 1/1995 | Murakami et al. | 324/309 |
| 5,477,146 A | 12/1995 | Jones | |
| 5,515,855 A | 5/1996 | Meyer et al. | |
| 5,517,120 A | 5/1996 | Misic et al. | |
| 5,521,506 A | 5/1996 | Misic et al. | |
| 5,602,479 A | 2/1997 | Srinivasan et al. | |
| 5,610,520 A | 3/1997 | Misic | |
| 5,751,146 A | 5/1998 | Hrovat | |
| 5,898,306 A | * 4/1999 | Liu et al. | 324/322 |
| 5,998,999 A | * 12/1999 | Richard et al. | 324/318 |
| 6,404,697 B1 | 3/2000 | Misic | |
| 6,198,288 B1 | * 3/2001 | Gauss et al. | 324/322 |

OTHER PUBLICATIONS

Meyer, et al., (1995), "A 3x3 Mesh Two–Dimensional Ladder Network Resonator for MRI of the Human Head", *Journal of Magnetic Resonance Series B*, 107: pp. 19–24.

Lin, et al., (1998), "A Novel Multi–segment Surface Coil for Neuro–Funtional Magnetic Resonance Imaging", *Magnetic Resonance in Medicine*, 39: pp. 164–168.

\* cited by examiner

*Primary Examiner*—Edward Lefkowitz
*Assistant Examiner*—Dixomara Vargas
(74) *Attorney, Agent, or Firm*—Mathew J. Sampson; Gregory L. Bradley; James R. Stevenson (57) ABSTRACT

A local or surface coil including a decoupling circuit to allow the coil to operate as a receive-only coil in a host MRI system, in which case the system body coil typically provides the transmit signal. Further, the local or surface coil includes a circuit to defeat the decoupling circuitry for both low power [receive] and high power [transmit] functions to allow the same physical coil to be used as a transmit/receive coil in addition to a receive-only coil. The two modes of the coil allow the user to select the mode of local or surface coil operation best suited to the particular type of imaging being performed.

20 Claims, 5 Drawing Sheets

MR LOCAL IMAGING COIL OPERABLE AS A RECEIVE ONLY OR A TRANSMIT/RECEIVE COIL

CROSS-REFERENCE TO RELATED APPLICATION

This application claims the benefit of U.S. Provisional Application No. 60/131,077 filed Apr. 26, 1999.

FIELD OF THE INVENTION

The present invention relates generally to magnetic resonance imaging ("MRI") and, more particularly, to coils for use in an MRI host device.

BACKGROUND

Local coils, surface coils and the like, are currently made in two forms: "receive only," and "transmit/receive." Local coils that are receive only generally use the MRI system body coil for excitation. This has the benefit of generally very uniform RF excitation, and therefore uniform tip angle and image uniformity, but the disadvantage of increased RF power deposition in the body of the patient, and potential problems with aliasing of undesired signal from outside of the imaging volume. For a transmit/receive local coil, the local coil itself provides the RF excitation to the region of interest. Transmit/receive local coils therefore improve the situation from the perspective of aliasing and power deposition, but generally produce a less uniform RF excitation field, and therefore less uniform distribution of tip angle over the imaging volume, and subsequently an image with reduced uniformity. The following discussion applies to both the single element, single receiver coils, and multiple element, multiple receiver coils, including phased array coils.

The practitioner's decision between techniques providing better uniformity and those providing reduced aliasing effects and power deposition is dependent upon the imaging technique employed, the target anatomy, and the aspects of the resulting image deemed most important for the particular scan. It would therefore be advantageous to be able to use a local coil as a receive only coil when the imaging process is best served by this, and as a transmit/receive coil when that configuration provides the best benefit.

SUMMARY OF THE INVENTION

In accordance with a first aspect of the present invention a local or surface coil is provided that can be user selected to be a receive only coil, or a transmit/receive coil, as desired. In its various embodiments, the invention may provide a basic coil with a manual mode [receive only or transmit/receive] selector or an electronic mode selector. Alternatively, the local coil may provide automatic electronic mode selection from an operation point command entered as a part of a scan protocol.

The invention consists of a local or surface coil that includes decoupling circuitry to allow it to operate as a receive only coil in a host MRI system, the system body coil typically being the transmit signal source. The local or surface coil also includes circuitry to defeat the decoupling circuitry for both low power [receive] and high power [transmit] functions to allow the same physical coil to be used as a transmit/receive coil. The two modes of the coil thus allow the user to select the mode of local or surface coil operation best suited to the particular type of imaging being performed.

Selection may be by manual means requiring operator intervention, or, alternatively, by automatic means via sensing of the coil type desired by the system operator from the bias pattern of the host MRI system, or other means. The selection means places the decoupling networks on the coil in the non-decoupled mode continuously for transmit/receive operation; for receive only operation, the decoupling networks are in the non-decoupled mode only for receive, and in the decoupled state during the application of the external transmit RF field. The decoupling networks are designed to operate in the non-decoupled mode under the electrical strain of the applied transmit power when the coil is used as a transmit/receive device, and also to withstand the effects of the external transmit RF field when in the decoupled mode [the coil operating as a receive only coil at this time].

DETAILED DESCRIPTION OF THE PRESENTLY PREFERRED EMBODIMENTS OF THE INVENTION

Figure 1:
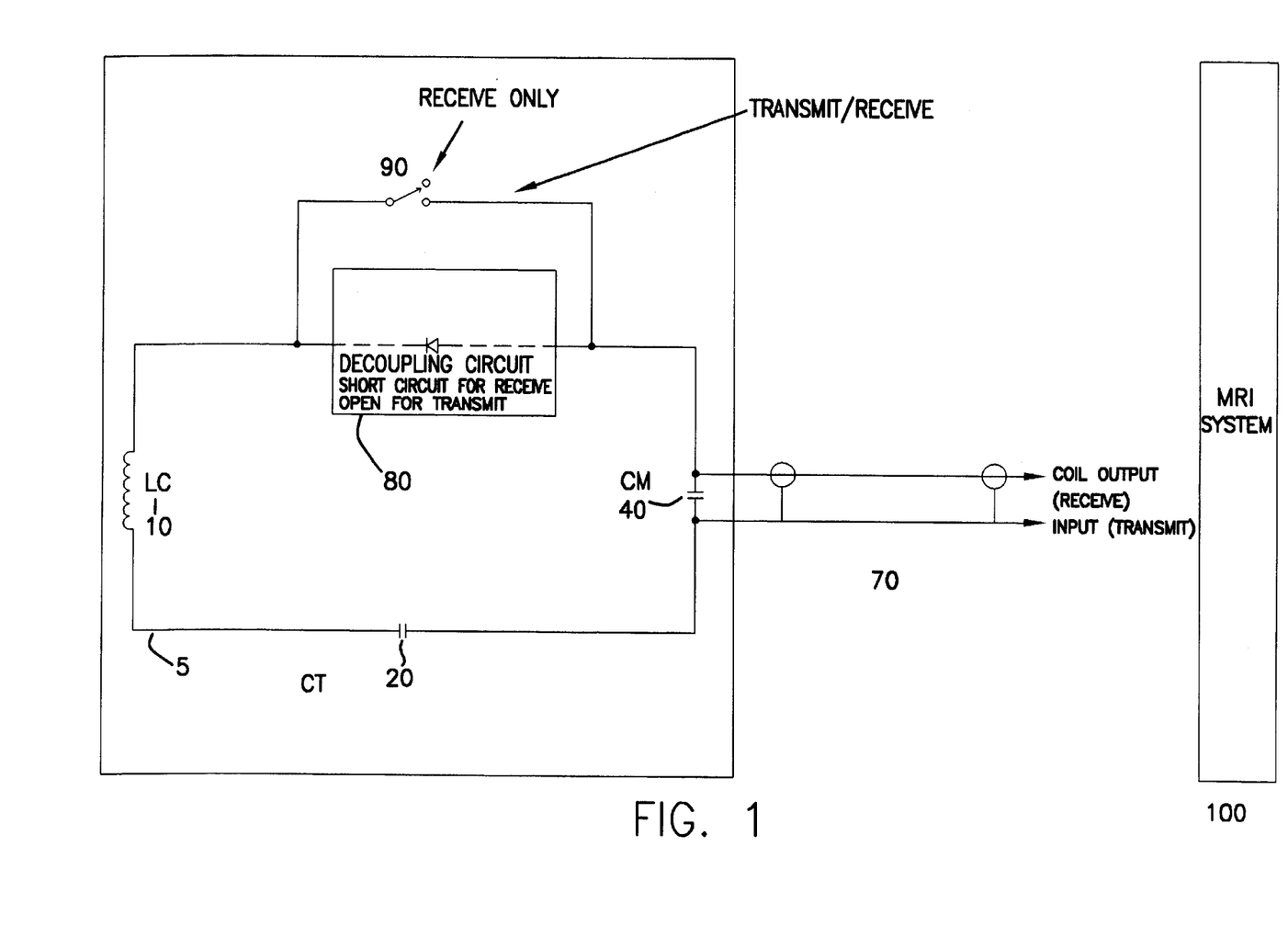
FIG. 1 illustrates a generalized architecture of a local coil in accordance with the present invention.

The presently preferred embodiments will now be described with reference to the drawing figures, in which like elements are referred to by like numerals. FIG. 1 illustrates a generalized schematic architecture of a local coil 5. For clarity, a single loop local coil 5 is shown. It is to be understood, however, that the local coil 5 is not so limited, and the discussion of the local coil 5 herein may be extended to known coil structures. For example, the local coil 5 may be volume coil such as a Helmholtz Pair, saddle coil, or birdcage resonator. The principles shown with the single loop can be readily extended to apply to more complex coil structures by those skilled in the art.

In FIG. 1, the inductance of the local coil 5 is represented by Lc 10. The capacitors Cm 40 and Ct 20 are selected to resonate with the inductance, Lc 10, at the operating frequency. The capacitors 20 and 40 also provide the appropriate impedance match from the local coil circuit to the host MRI system 100, typically 50 ohms. The local coil 5 also includes a decoupling circuit 80 and a mode selection switch 90.

For receive only operation, the mode selection switch 90 is set to an open position. When using the coil 5 in the receive only mode, the decoupling circuit 80 approximates a short circuit for receive operation, thus completing the coil circuit. During the transmit cycle, whilst the coil is used as a receive-only coil, the decoupling circuit 80 approximates an open circuit. The decoupling circuit 80 may be implemented using a series PIN diode switch, with the appropriate bias applied by the host MRI system 100, or using a network with crossed RF high speed switching diodes, with the diodes switched by the induced potential from the applied external RF field.

For transmit/receive operation, the decoupling circuit 80 is simply shorted out by a mechanical or other type switch, such as by setting the mode selection switch 90 to the closed position. Thus, the coil 5 remains operational at all times when transmit/receive operation is selected.

Figure 2:
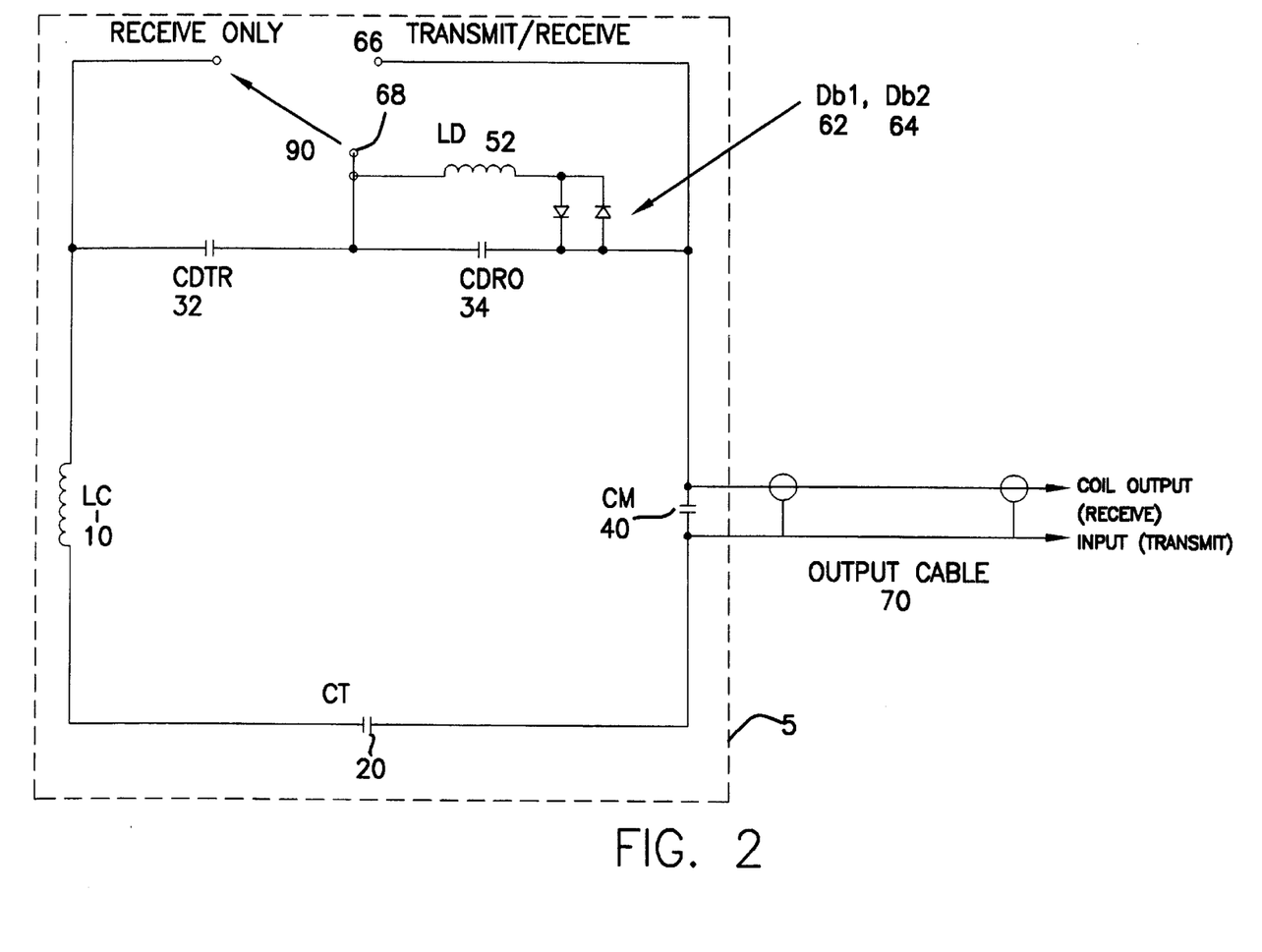
FIG. 2 illustrates a first embodiment having a manually-selected mode of operation, which requires an operator to physically select the mode of coil operation by placing a selection switch in the appropriate position.

FIG. 2 illustrates a first embodiment of a local coil 5 that is operable in either receive only or transmit/receive modes. As with FIG. 1, for clarity, a single loop local coil 5 is shown. The principles shown with the single loop can be readily extended to apply to the more complex coil structures by those skilled in the art.

In FIG. 2, the inductance of the coil 5 is represented by Lc 10. The capacitors Cm 40, Cdtr 32, and Ct 20 are selected to resonate with the inductance of the coil, Lc 10, at the operating frequency, and to provide the appropriate impedance match from the local coil 5 circuit to the host MRI system, typically 50 ohms. The value of Cdtr 32 is selected to be a reasonable value for use in a parallel resonant decoupling network. For typical applications, the capacitor Cdtr 32 would have a reactance of approximately 10 to 200 ohms at the coil operating frequency.

For transmit/receive operation, a receive only decoupling network is shorted out by a mechanical or other type switch 90. In other words, the state of the switch 90 in FIG. 2 is changed for transmit/receive operation to short nodes 66 and 68 together. The receive only decoupling network, as shown in FIG. 2, includes decoupling inductor, Ld, 52, receive only decoupling capacitor, Cdro 34, and parallel diodes, Dd1 62 and Dd2 64. Thus, the coil remains operational at all times when transmit/receive operation is selected using switch 90. The capacitor, Cdtr 32, provides a reactance equivalent to that of the decoupling network in the receive, or not decoupled, mode.

For receive only operation, the state of the switch 90 is as shown in FIG. 2. The decoupling network equals the reactance of capacitor Cdtr 32 for receive operation, thus completing and resonating the coil circuit. During the transmit cycle, the decoupling network approximates an open circuit by virtue of the decoupling inductor Ld 52 creating a parallel resonant circuit with Cdro 34 by virtue of the decoupling switching diodes Dd1 and Dd2, 62 and 64, connecting the inductor 52 in parallel with Cdro 34. This may be implemented using a series PIN diode switch (not shown) with the appropriate bias applied by the host MRI system, or as shown in FIG. 2 by a network using crossed RF high speed switching diodes, with the diodes switched by the induced potential from the applied external RF field.

Figure 3:
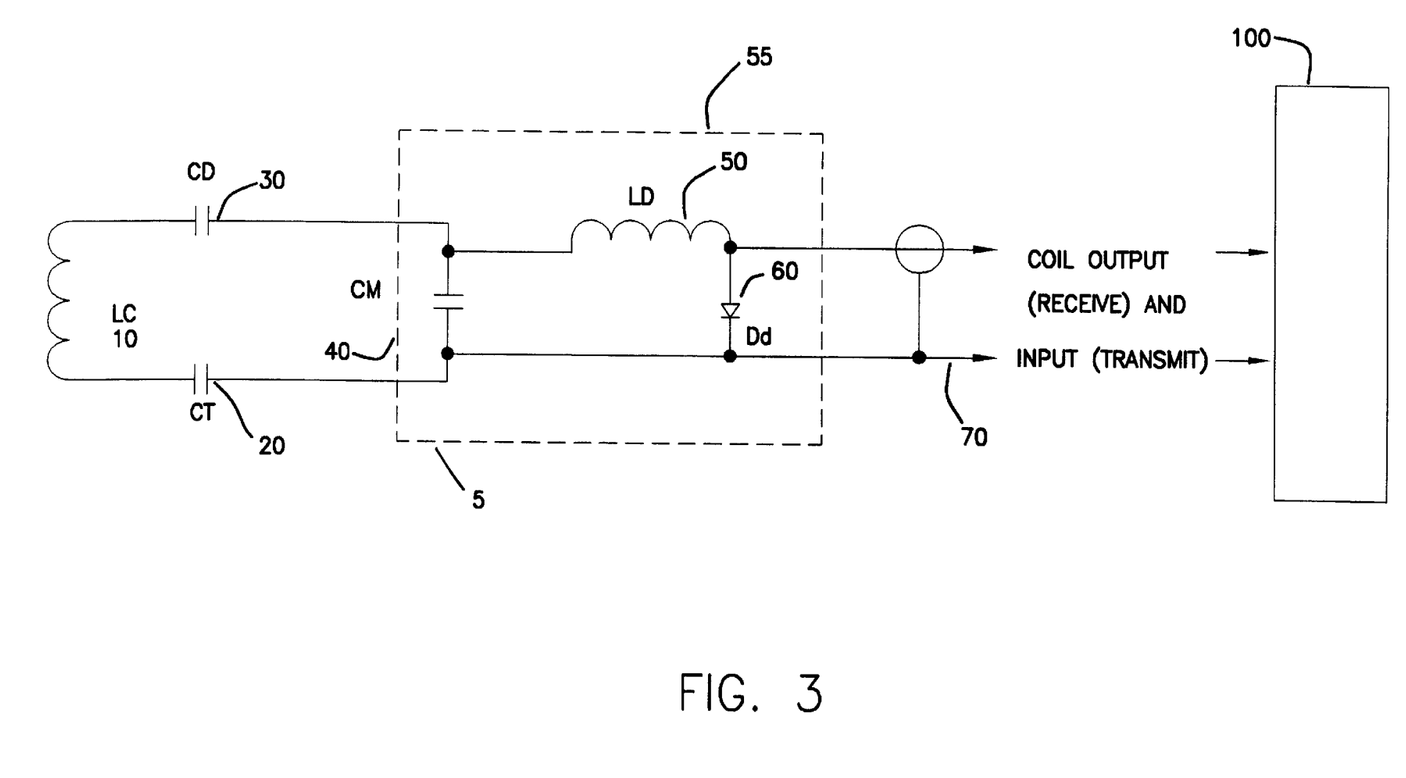
FIG. 3 illustrates a second embodiment that provides electronic mode selection, wherein the electronic selection is accomplished by the application of appropriate electrical potentials.

FIG. 3 illustrates a second embodiment providing electronic selection between receive only mode and transmit/receive mode. The electronic selection is accomplished by the application of appropriate electrical potentials, for each means, mode and phase of operation. As with FIGS. 1 and 2, for clarity, a single loop local coil 5 is shown. The principles shown with the single loop coil 5 may be readily extended to apply to the more complex coil structures by those skilled in the art.

In FIG. 3, the inductance of the coil 5 is represented by the inductor Lc 10. The capacitors Cm 40, Cd 30, and Ct 20 are selected to resonate the inductance Lc 10 at the operating frequency, and to provide the appropriate impedance match from the local coil 5 to the host MRI system, typically 50 ohms. The decoupling circuit 55 has been moved to the matching capacitor Cm 40 in this example. This allows the DC bias voltage to be easily and simply superimposed on the signal line RF coaxial cable 70.

For receive only operate the decoupling circuit 55 consists of the capacitor Cm 40, inductor Ld 50, and RF switching diode Dd 60. The magnitude of the reactance of the inductor Ld 50 equals that of the capacitor Cm 40. During the transmit cycle of the system body coil (not shown), the decoupling network 55 approximates an open circuit in series with the RF circuit of the coil 5 by virtue of the decoupling inductor LD 50 creating a parallel resonant circuit with capacitor Cm 40 by virtue of toe decoupling switching diode Dd1 60 connecting the inductor Ld 50 in parallel with capacitor Cm 40. This may be implemented using a series PIN diode 60 switch with the forward bias applied by the host MRI system 100, as shown in the illustration. During the receive cycle for the receive only coil, a reverse bias is applied, disconnecting the inductor Ld 50 from its parallel connection to the capacitor Cm 40.

For transmit/receive operation, the decoupling network 55 is biased "off" by virtue of a large reverse bias potential applied to the RF switching PIN diode Dd 60. Thus, the coil 5 remains operational at all times when transmit/receive operation is selected. The capacitor Cm 40 and the series inductor Ld 50 provide a match from the coil to the coaxial transmission line 70, typically 50 ohms. The reverse bias on the PIN diode 60 must be sufficiently large to prevent the applied transmit RF voltage from driving the PIN diode 60 into forward conduction, and thus a low RF impedance.

Figure 5:
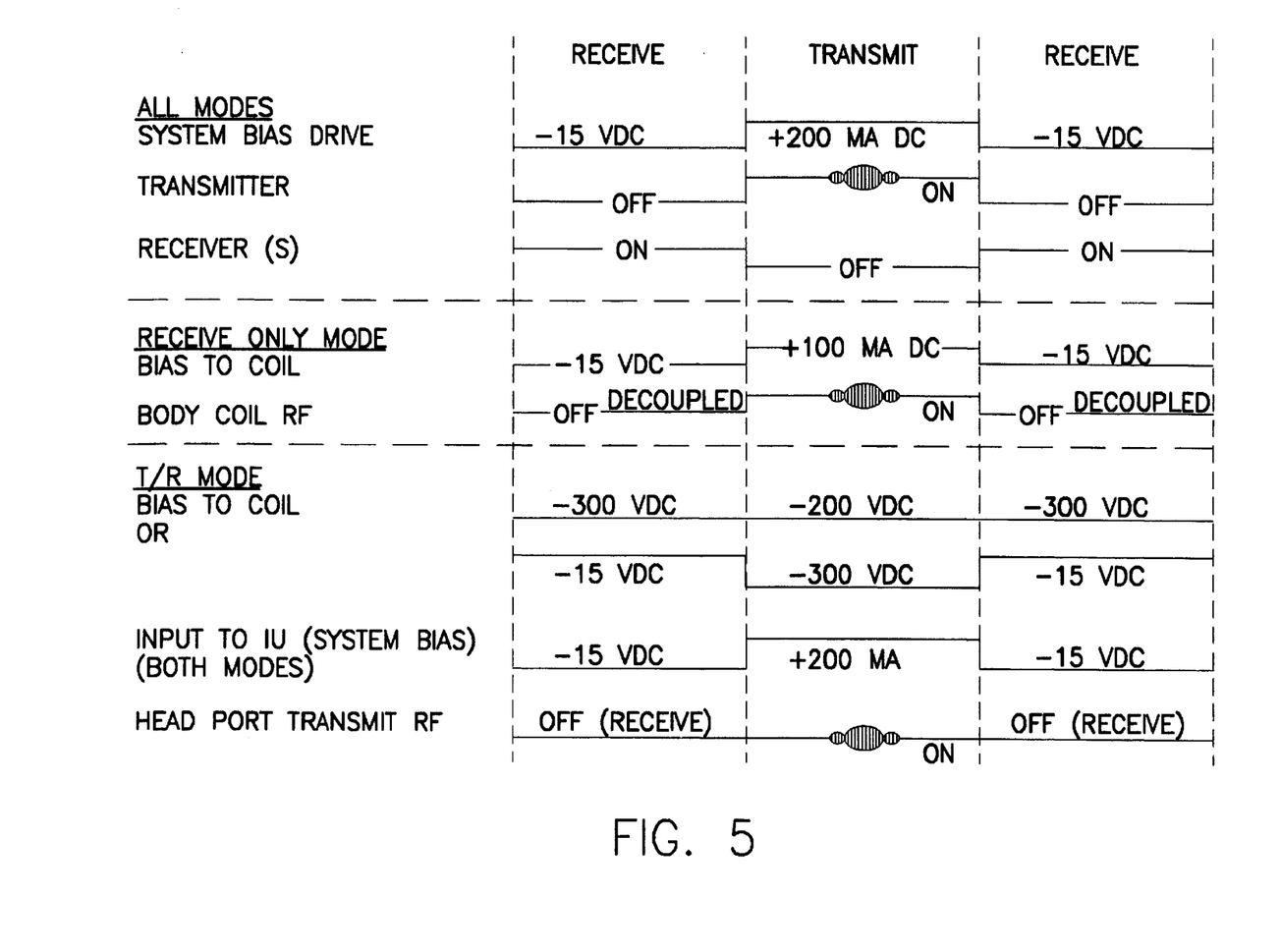
FIG. 5 is a timing diagram for the bias signals discussed above with reference to FIGS. 3 and 4.

Operation of the local coil 5 and electronic selection between receive only mode and transmit/receive mode is described above. Examples for bias conditions for the PIN diode 60 are also present in FIG. 3 for operation of the local coil 5 in receive only mode and in transmit/receive mode. FIG. 5 provides a timing diagram for the application of the bias signals to effect mode selection and operation of the local coil 5 as described above.

Specifically, when the local coil 5 is being operated in receive only mode and another coil, such as the MRI system body coil, is transmitting an RF excitation signal, the decoupling network 55 presents essentially an open circuit to the local coil 5. For the example shown in FIG. 3, the decoupling network 55 presents essentially an open circuit to the local coil 5 when a +100 mA bias current is applied to the PIN diode 60. The bias current advantageously causes the PIN diode 60 to present a very low RF resistance, essentially a short circuit, across the terminal, thereby forming a parallel resonant circuit between elements Ld 50 and Cm 40. By placing the PIN diode 60 in the "on" or conducting mode, the bias current, in conjunction with the decoupling inductor 50 and matching capacitor 40, places a very high impedance in the coil loop Lc of the local coil 5, thereby decoupling the coil 5 from the external RF transmit field. In addition, the bias current in the PIN diode 60 effectively shorts out any large signal output from the local coil 5, thereby protecting the preamplifier hardware of the MRI system.

Although the bias current is +100 mA in the example above, any current level greater than approximately 50 mA is sufficient for most applications. Under certain conditions, however, a bias current as high as 500 mA may be required. Factors governing the required magnitude of the bias current include the applied RF power, the operating frequency, the size of the local coil 5 inductance Lc 10, the efficiency of the decoupling network, the carrier lifetime of the PIN diode 60, and the amount of stored charge in the diode 60.

For the receive cycle when the coil 5 is operated in receive only mode, a reverse bias is applied to the diode 60 as noted above. The level of the applied voltage in this case need only be sufficient to ensure that the diode 60 is the "off" or non-conducting state. Because the RF signal voltage in the receive mode is typically on the order of a few millivolts or less, a small bias voltage may be used.

In FIG. 3, the example bias voltage of 15 VDC is indicated. This example reflects a convenient choice because the GE Medical Systems Signa MRI system, as well as other MRI systems, provides a 15 VDC source directly. In light of the foregoing, however, larger or smaller reverse bias voltage levels may alternatively be used as long as the level is sufficient to ensure that the diode 60 remains in the "off" state.

Turning now to operation of the local coil in the transmit/receive mode, it is noted above that when the coil 5 is transmitting an RF excitation signal, the diode 60 must be reverse biased with a voltage that is sufficiently large to prevent the applied RF excitation signal from driving the PIN diode 60 into forward conduction. The transmit mode RF power applied to the coil 5 is generally on the order of approximately 5 to 500 watts peak envelope power, although it may be higher under atypical circumstances. The 5 to 500 watt range results in an applied RF voltage at the power envelope peek of 16 to 158 volts RMS, 22 to 224 volts peak, and 45 to 477 volts peak to peak.

In order for the PIN diode 60 to remain nonconducting or "off," the PIN diode 60 should never be used hr a forward bias state with current flowing. Typically, tie reverse bias voltage would be selected to exceed the peak applied RF voltage value–224 VDC). For the example shown in FIG. 3, a value of –300 VDC is shown. Other bias voltages may alternatively be used, so long as they cause the diode 60 to remain "off" during application of the RF excitation signal.

For receive mode during transmit/receive operation of the coil 5, the discussion above with respect to receive mode during receive only operation applies. In particular, the –15 VDC power supply from the MRI system may be used directly. In accordance with a preferred embodiment, however, a –300 VDC bias voltage is used. This provides the benefit of eliminating the need to switch between power supplies when using the coil in the transmit/receive mode. In other words, because –300 VDC is used during the transmit cycle of the transmit/receive operation, the same bias voltage is used during the receive cycle. This provides the benefit of either simplifying power source requirements or simplifying switching requirements between different power source values.

Figure 4:
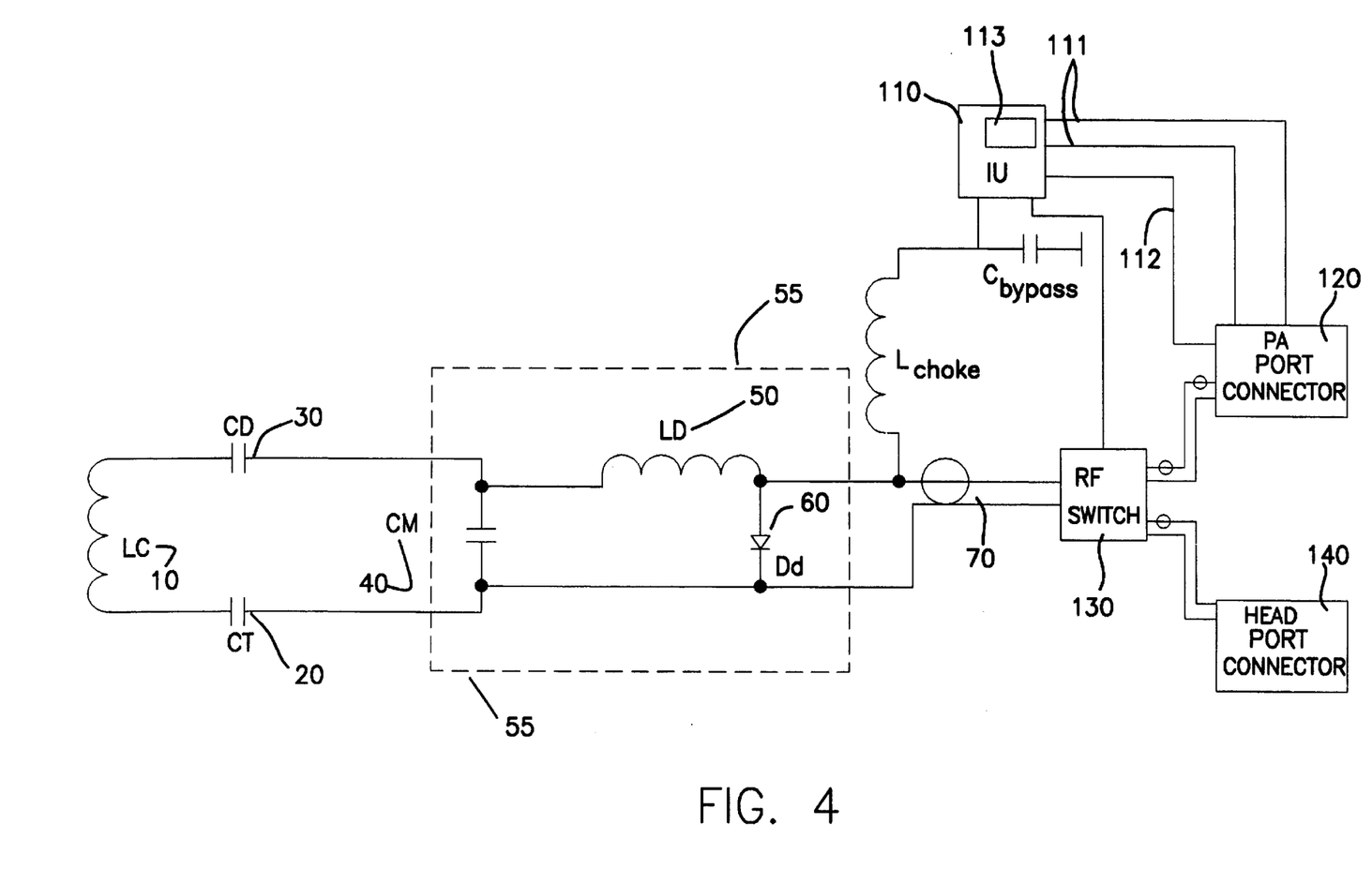
FIG. 4 illustrates an implementation of the second embodiment shown in FIG. 3 that is specifically applicable to the GE Medical Systems Signa MRI system.

FIG. 4 illustrates an implementation of the second embodiment, shown in FIG. 3, that is specifically adapted for use with the GE Medical Systems Signa MRI system. As with FIGS. 1, 2, and 3, a single loop local coil 5 is shown for clarity. The principles shown with the single loop can be readily extended to apply to the more complex coil structures by those skilled in the art.

In FIG. 4, the inductance of the coil 5 is represented by inductor Lc 10. The capacitors Cm 40, Cd 30, and Ct 20 are selected to resonate with the inductance Lc 10 at the operating frequency, and to provide the appropriate impedance match from the local coil 5 to the host MRI system 100, 50 ohms in this example. As with the example in FIG. 3, the decoupling circuit 55 has been moved to the matching capacitor Cm 40 in this example. This allows the DC bias voltage to be easily and simply superimposed on the signal line RF coaxial cable 70.

As with the example in FIG. 3, for receive only operation, the decoupling circuit 55 consists of capacitor Cm 40, inductor Ld 50, and RF switching diode Dd 60. The magnitude of the reactance of inductor Ld 50 equals that of capacitor Cm 40. During the transmit cycle, the decoupling network 55 approximates an open circuit in series with the RF circuit of the coil 5 by virtue of the decoupling inductor Ld 50 creating a parallel resonant circuit with the capacitor Cm 40 by virtue of the decoupling switching diode Dd1 60 connecting the inductor Ld 50 in parallel with the capacitor Cm 40. This may be accomplished by the use of a series PIN diode 60 switch with the forward bias applied by the host MRI system 100 as shown in the illustration. During the receive cycle for the receive only coil, a reverse bias is applied, disconnecting the inductor Ld 50 from its parallel connection to the capacitor Cm 40.

As described above for FIG. 3, for transmit/receive operation, the decoupling network 55 is biased "off" by virtue of a large reverse bias potential applied to the RF switching PIN diode Dd 60. Thus, the coil 5 remains operational at all times when transmit/receive operation is selected. The capacitor Cm 40 and the series inductor Ld 50 provide a match from the coil to the coaxial transmission line 70, typically 50 ohms. The reverse bias on the PIN diode 60 must be sufficiently large to prevent the applied transmit RF voltage from driving the PIN diode 60 into forward conduction, and thus a low RF impedance.

The local coil 5 includes an interface unit 110 ("Iu") that connects with the host MRI system 100 via the GEMS Signa Head Coil Port 140 and PA Coil Port 120. The interface unit 110 is coupled to the 15 VDC power supply of the host MRI system 100 over lines 111. From the 15 VDC power supply of host MRI system, the interface unit 110 generates the large reverse bias voltage needed for transmit/receive operation of this coil 5, and also provides the signal management and bias switching needed to automatically switch the coil 5 from the receive only mode to the transmit/receive mode. Selection betwixt receive only and transmit/receive operation is achieved by the use of different system Coil Configuration Files. The bias pattern of the host MRI system 100 is decoded to provide a command to the interface unit 110 over the Code Pattern line 112. The file values will properly configure the host system for transmit/receive operation, or receive only operation using the host system body coil for transmit.

In the receive only mode, the interface unit 110 provides about –15 VDC reverse bias to the PIN decoupling switching diode Dd 60 on the coil 5. When the system body coil is transmitting, about +100 milliamperes of current is supplied by the interface unit 110 to forward bias diode Dd 60. The output signal of the coil 5 is connected to an appropriate receiver port via the Phased Array Coil Port 120. Transmission is accomplished via the host system body coil; switching betwixt receive and transmit bias conditions is initiated via the host system bias state at the Phased Array Port 120 or Head Coil Port 140.

For transmit/receive mode, a high frequency power converter 113 is used during the transmit cycle only to produce a –300 VDC bias potential from the available +15 VDC and –15 VDC power sources from the host GEMS Signa system at the Phased Array Port 120. The power converter, which is preferably part of the interface unit 110, is enabled only during transmit to prevent any extraneous electrical noise or harmonics of the inversion oscillator causing artifacts in the image obtained from the data collected during the receive cycle. The interface unit 110 applies the transmit signal from the system Head Coil Port to the local coil 5. The decoupling PIN diode 60 is reverse biased sufficiently to prevent conduction of the PIN diode 60 during any portion of the applied RF transmit power. During receive, the signal output of the local coil is directed to the appropriate Phased Array Coil Port 120. All switching functions are performed by the interface unit 110.

This last referenced embodiment is specific in detail to the GE Medical Systems Signa MRI scanner, but can be applied with modifications, which will be apparent to those skilled in the art, to other host MRI systems. The coil 5 shown in FIG. 4 of this embodiment automatically selects the appropriate mode by decoding the pattern of the Port Enable Mask generated by the host GEMS MRI system at the Phased Array Coil Port, and causes the appropriate electrical potentials as indicated to be applied as and when needed. Specifically, the interface unit 110 provides the appropriate bias voltages or currents at the appropriate time. The bias voltages and currents are derived by the interface unit 110 from the 15 VDC supply of the host MRI system using voltage/current conversion techniques that are well known to those skilled in the art. In addition, the interface unit 110 preferably detects the desired bias conditions (mode of operation) by decoding the transmit/receive ("T/R") driver bias patterns from the host MRI system. The T/R driver bias patterns are set in accordance with the Port Enable Mask selected from the host system coil configuration files in accordance with a coil name selected by the system operator. Furthermore, the interface unit 110 is operable to switch the bias conditions in response to the operation mode (receive only or transmit/receive) and the state (transmit or receive) of the host MRI system. The interface unit 110 also controls PIN diode RF switch 130, shown in FIG. 4, to deliver the RF signal received by the local coil 5 to the appropriate port (120 or 140) of the host MRI system.

In accordance with an alternative embodiment, a host MRI system may be modified to generate the bias potentials discussed above and to apply them to the local coil 5 in accordance with the timing diagram of FIG. 5. For example, the interface unit 110 described above may be incorporated into the host MRI system, rather than being part of the local coil 5 as described above.

Several versions of the selection means have been described. The first embodiment is a manually selected version requiring the operator to physically select the mode of coil operation, and place the selection switches in the appropriate position as discussed above with reference to FIGS. 1 and 2. A second embodiment illustrates a completely electronic version; the selection is accomplished by the application of appropriate electrical potentials as needed for each means, mode, and phase of operation, as discussed above with reference to FIG. 3. A third illustration shows a specific embodiment applicable to the GE Medical Systems Signa MRI system as discussed above with reference to FIG. 4. The third embodiment automatically selects the appropriate mode by decoding the pattern of the Port Enable Mask generated by the host GEMS MRI system at the Phased Array Coil Port, and causes the appropriate electrical potentials as indicated in FIGS. 3 and 4 to be applied as and when needed.

As will be apparent to those skilled in the art, the tuning and matching circuit elements described with reference to the foregoing embodiments may generally be implemented using either discrete elements or distributed or transmission line techniques. Specific component values for the schematic diagrams are dependent upon the particular characteristics of the local coil and can be readily derived by those skilled in the art.

It is intended that the foregoing detailed description be regarded as illustrative rather than limiting. It is also to be understood that the following claims including all equivalents are intended to define the scope of the invention.

We claim:

1. A local imaging coil for use with a host MRI system, the coil comprising:
   at least one conductive loop;
   a decoupling circuit connected to the at least one conductive loop; and
   means for selecting a mode of operation of the local coil, said selecting means being coupled to said conductive loop and said decoupling circuit.

2. A local imaging coil as claimed in claim 1, wherein said mode of operation is selected from the group consisting of a receive only mode and a transmit/receive mode.

3. A local imaging coil as claimed in claim 1, wherein said selecting means comprises a switch.

4. A local imaging coil as claimed in claim 3, wherein said switch is manually operable.

5. A local imaging coil as claimed in claim 3, wherein said switch is electronically actuated.

6. A local imaging coil as claimed in claim 3, wherein said switch comprises a PIN diode that is automatically electronically actuated in accordance with a signal provided by the host MRI system.

7. A local imaging coil for use with a host MRI system, the coil comprising:
   at least one conductive loop;
   a decoupling circuit connected to the at least one conductive loop; and
   a two-state mode selection switch coupled to bypass the decoupling circuit in the conductive loop.

8. A local imaging coil as claimed in claim 7, wherein a first state of said two-state mode selection switch causes the coil to operate in a receive only mode.

9. A local imaging coil as claimed in claim 8, wherein the first state corresponds to the two-state mode selection switch being open.

10. A local imaging coil as claimed in claim 7, wherein a second state of said two-state mode selection switch causes the coil to operate in a transmit/receive mode.

11. A local imaging coil as claimed in claim 10, wherein the second state corresponds to the two-state mode selection switch being closed.

12. A local imaging coil as claimed in claim 7, wherein the decoupling circuit comprises a PIN diode switch, the state of the PIN diode switch being selectably altered by a bias signal applied by the host MRI system.

13. A local imaging coil as claimed in claim 7, wherein the decoupling circuit comprises a pair of crossed RF high speed switching diodes, the diodes being switched by an induced potential generated by an externally applied RF field.

14. A local imaging coil for use with a host MRI system, the coil comprising:
   at least one conductive loop; and
   a decoupling circuit connected between the at least one conductive loop and the host MRI system, said decoupling circuit comprising a capacitor coupled to an inductor coupled to a switching diode, wherein said decoupling circuit switches the coil between a receive only mode of operation and a transmit/receive mode of operation in accordance with bias signals applied by the host MRI system to the switching diode.

15. A local imaging coil as claimed in claim 14, wherein said decoupling circuit approximates an open circuit during a transmit cycle of the receive only mode and said decoupling circuit couples the coil to the host MRI system during a receive cycle of the receive only mode.

16. A local imaging coil as claimed in claim 14, wherein the host MRI system applies a large reverse bias potential to the switching diode when the transmit/receive mode of operation is selected.

17. A local imaging coil for use with a host MRI system, the coil comprising:

at least one conductive loop;

a decoupling circuit connected to the at least one conductive loop, said decoupling circuit comprising a switching diode; and an interface unit coupled between the decoupling circuit and the host MRI system, wherein said decoupling circuit switches the coil between a receive only mode of operation and a transmit/receive mode of operation in accordance with bias signals supplied by the interface unit to the switching diode.

18. A local imaging coil as claimed in claim 17, wherein the interface unit receives as inputs from the host MRI system a 15 VDC power supply and a code pattern corresponding to a desired mode of operation.

19. A local imaging coil as claimed in claim 18, wherein the interface unit provides an output bias signal that is coupled to the switching diode, the bias signal being determined in accordance with the code pattern suplied by the host MRI system.

20. A local imaging coil as claimed in claim 17, wherein the interface unit comprises a high frequency power converter that is operable to selectively convert the 15 VDC input into a bias potential that is at least −200 VDC.

* * * * *